US008455051B2

(12) United States Patent
Renn et al.

(10) Patent No.: US 8,455,051 B2
(45) Date of Patent: *Jun. 4, 2013

(54) APPARATUSES AND METHODS FOR MASKLESS MESOSCALE MATERIAL DEPOSITION

(75) Inventors: Michael J. Renn, Hudson, WI (US); Bruce H. King, Albuquerque, NM (US); Marcelino Essien, Cedar Crest, NM (US); Gregory J. Marquez, Albuquerque, NM (US); Manampathy G. Giridharan, Mason, OH (US); Jyh-Cherng Sheu, Hsinchu City (TW)

(73) Assignee: Optomec, Inc., Albuquerque, NM (US)

( * ) Notice: Subject to any disclaimer, the term of this patent is extended or adjusted under 35 U.S.C. 154(b) by 127 days.
This patent is subject to a terminal disclaimer.

(21) Appl. No.: 12/976,906

(22) Filed: Dec. 22, 2010

(65) Prior Publication Data
US 2011/0129615 A1 Jun. 2, 2011

Related U.S. Application Data

(60) Continuation of application No. 12/349,279, filed on Jan. 6, 2009, now Pat. No. 7,987,813, which is a division of application No. 11/317,457, filed on Dec. 22, 2005, now Pat. No. 7,485,345, which is a division of application No. 10/346,935, filed on Jan. 17, 2003, now Pat. No. 7,045,015, which is a continuation-in-part of application No. 09/574,955, filed on May 19, 2000, now Pat. No. 6,823,124, which is a continuation of application No. 09/408,621, filed on Sep. 30, 1999, said application No. 10/346,935 is a continuation-in-part of application No. 09/584,997, filed on Jun. 1, 2000, now Pat. No. 6,636,676, said application No. 10/346,935 is a continuation-in-part of application No. 10/060,960, filed on Jan. 30, 2002, now abandoned, said application No. 10/346,935 is a continuation-in-part of application No. 10/072,605, filed on Feb. 5, 2002, now Pat. No. 7,108,894.

(60) Provisional application No. 60/102,418, filed on Sep. 30, 1998.

(51) Int. Cl.
*B05D 5/12* (2006.01)

(52) U.S. Cl.
USPC ............. 427/256; 427/58; 427/98.4; 427/102

(58) Field of Classification Search
None
See application file for complete search history.

(56) References Cited

U.S. PATENT DOCUMENTS

| 3,474,971 A | 10/1969 | Goodrich |
| 3,590,477 A | 7/1971 | Cheroff et al. |

(Continued)

FOREIGN PATENT DOCUMENTS

| DE | 198 41 401 | 4/2000 |
| EP | 0 331 022 A2 | 9/1989 |

(Continued)

OTHER PUBLICATIONS

Webster's Ninth New Collegiate Dictionary, Merriam-Webster, Inc., Springifled, MA. USA, 1990, 744.

(Continued)

*Primary Examiner* — James Lin
*Assistant Examiner* — Francisco Tschen
(74) *Attorney, Agent, or Firm* — Philip D. Askenazy; Peacock Myers, P.C.

(57) ABSTRACT

Apparatuses and processes for maskless deposition of electronic and biological materials. The process is capable of direct deposition of features with linewidths varying from the micron range up to a fraction of a millimeter, and may be used to deposit features on substrates with damage thresholds near 100° C. Deposition and subsequent processing may be carried out under ambient conditions, eliminating the need for a vacuum atmosphere. The process may also be performed in an inert gas environment. Deposition of and subsequent laser post processing produces linewidths as low as 1 micron, with sub-micron edge definition. The apparatus nozzle has a large working distance—the orifice to substrate distance may be several millimeters—and direct write onto non-planar surfaces is possible.

31 Claims, 7 Drawing Sheets

U.S. PATENT DOCUMENTS

Figure 1:
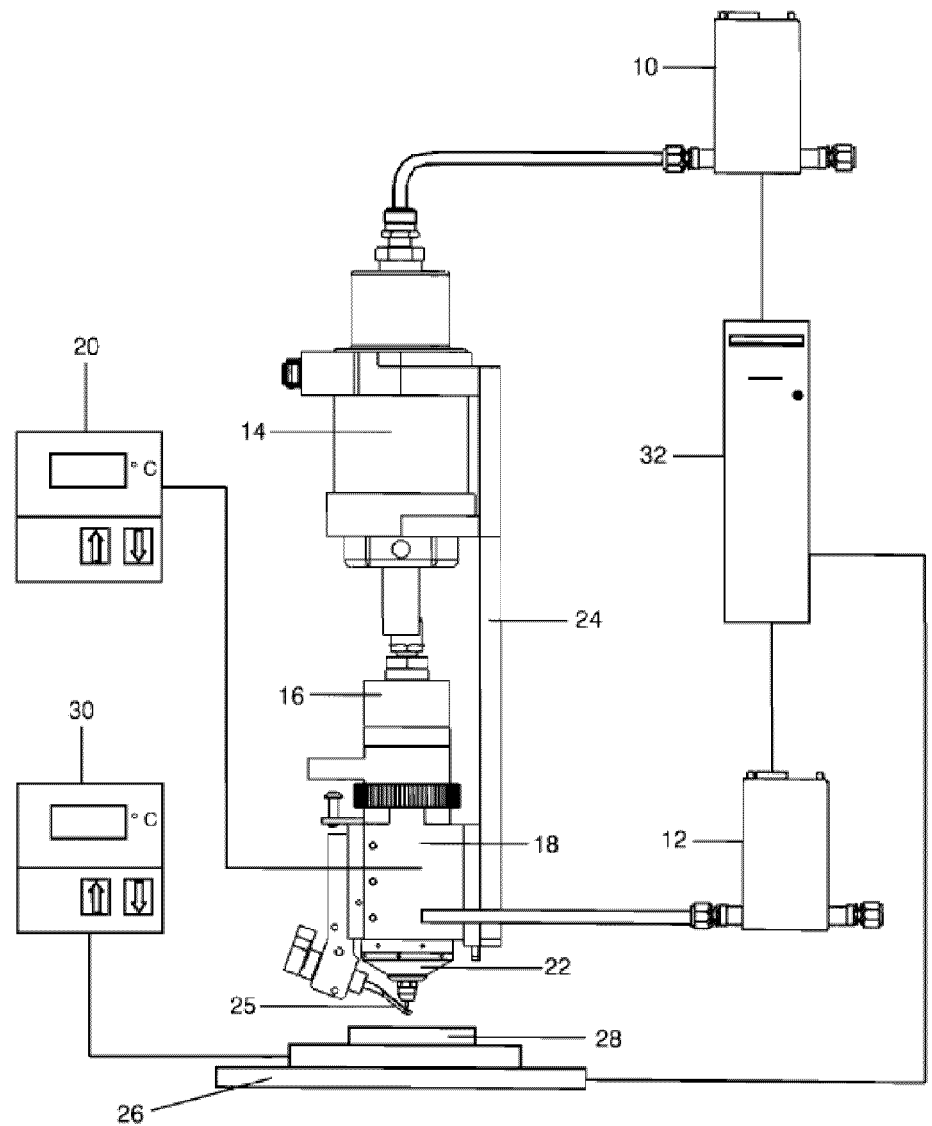

| | | |
|---|---|---|
| 3,642,202 A | 2/1972 | Angelo |
| 3,715,785 A | 2/1973 | Brown et al. |
| 3,808,432 A | 4/1974 | Ashkin |
| 3,808,550 A | 4/1974 | Ashkin |
| 3,846,661 A | 11/1974 | Brown et al. |
| 3,854,321 A | 12/1974 | Dahneke |
| 3,901,798 A | 8/1975 | Peterson |
| 3,959,798 A | 5/1976 | Hochberg et al. |
| 3,974,769 A | 8/1976 | Hochberg et al. |
| 3,982,251 A | 9/1976 | Hochberg |
| 4,004,733 A | 1/1977 | Law |
| 4,016,417 A | 4/1977 | Benton |
| 4,019,188 A | 4/1977 | Hochberg |
| 4,034,025 A | 7/1977 | Martner |
| 4,046,073 A | 9/1977 | Mitchell et al. |
| 4,046,074 A | 9/1977 | Hochberg et al. |
| 4,092,535 A | 5/1978 | Ashkin et al. |
| 4,112,437 A | 9/1978 | Mir et al. |
| 4,132,894 A | 1/1979 | Yule |
| 4,171,096 A | 10/1979 | Welsh et al. |
| 4,200,669 A | 4/1980 | Schaefer et al. |
| 4,228,440 A | 10/1980 | Horike et al. |
| 4,235,563 A | 11/1980 | Hine et al. |
| 4,269,868 A | 5/1981 | Livsey |
| 4,323,756 A | 4/1982 | Brown et al. |
| 4,400,408 A | 8/1983 | Asano et al. |
| 4,453,803 A | 6/1984 | Hidaka et al. |
| 4,485,387 A | 11/1984 | Drumheller |
| 4,497,692 A | 2/1985 | Gelchinski et al. |
| 4,601,921 A | 7/1986 | Lee |
| 4,605,574 A | 8/1986 | Yonehara et al. |
| 4,670,135 A | 6/1987 | Marple et al. |
| 4,685,563 A | 8/1987 | Cohen et al. |
| 4,689,052 A | 8/1987 | Ogren et al. |
| 4,694,136 A | 9/1987 | Kasner et al. |
| 4,724,299 A | 2/1988 | Hammeke |
| 4,733,018 A | 3/1988 | Prabhu et al. |
| 4,823,009 A | 4/1989 | Biemann et al. |
| 4,825,299 A | 4/1989 | Okada et al. |
| 4,826,583 A | 5/1989 | Biernaux et al. |
| 4,893,886 A | 1/1990 | Ashkin et al. |
| 4,904,621 A | 2/1990 | Loewenstein et al. |
| 4,911,365 A | 3/1990 | Thiel et al. |
| 4,920,254 A | 4/1990 | DeCamp et al. |
| 4,927,992 A | 5/1990 | Whitlow et al. |
| 4,947,463 A | 8/1990 | Matsuda et al. |
| 4,971,251 A | 11/1990 | Dobrick et al. |
| 4,978,067 A | 12/1990 | Berger et al. |
| 4,997,809 A | 3/1991 | Gupta |
| 5,032,850 A | 7/1991 | Andeen et al. |
| 5,038,014 A | 8/1991 | Pratt et al. |
| 5,043,548 A | 8/1991 | Whitney et al. |
| 5,064,685 A | 11/1991 | Kestenbaum et al. |
| 5,126,102 A | 6/1992 | Takahashi et al. |
| 5,164,535 A | 11/1992 | Leasure |
| 5,170,890 A | 12/1992 | Wilson et al. |
| 5,173,220 A | 12/1992 | Reiff et al. |
| 5,176,328 A | 1/1993 | Alexander |
| 5,176,744 A | 1/1993 | Muller |
| 5,182,430 A | 1/1993 | Lagain |
| 5,194,297 A | 3/1993 | Scheer et al. |
| 5,208,431 A | 5/1993 | Uchiyama et al. |
| 5,245,404 A | 9/1993 | Jannson et al. |
| 5,250,383 A | 10/1993 | Naruse |
| 5,254,832 A | 10/1993 | Gartner et al. |
| 5,270,542 A | 12/1993 | McMurry et al. |
| 5,292,418 A | 3/1994 | Morita et al. |
| 5,306,447 A | 4/1994 | Marcus et al. |
| 5,322,221 A | 6/1994 | Anderson |
| 5,335,000 A | 8/1994 | Stevens |
| 5,343,434 A | 8/1994 | Noguchi |
| 5,344,676 A | 9/1994 | Kim et al. |
| 5,359,172 A | 10/1994 | Kozak et al. |
| 5,366,559 A | 11/1994 | Periasamy |
| 5,378,505 A | 1/1995 | Kubota et al. |
| 5,378,508 A | 1/1995 | Castro et al. |
| 5,393,613 A | 2/1995 | MacKay |
| 5,398,193 A | 3/1995 | deAngelis |
| 5,403,617 A | 4/1995 | Haaland |
| 5,405,660 A | 4/1995 | Psiuk et al. |
| 5,418,350 A | 5/1995 | Freneaux et al. |
| 5,449,536 A | 9/1995 | Funkhouser et al. |
| 5,477,026 A | 12/1995 | Buongiorno |
| 5,486,676 A | 1/1996 | Aleshin |
| 5,491,317 A | 2/1996 | Pirl |
| 5,495,105 A | 2/1996 | Nishimura et al. |
| 5,512,745 A | 4/1996 | Finer et al. |
| 5,518,680 A | 5/1996 | Cima et al. |
| 5,529,634 A | 6/1996 | Miyata et al. |
| 5,578,227 A | 11/1996 | Rabinovich |
| 5,607,730 A | 3/1997 | Ranalli |
| 5,609,921 A | 3/1997 | Gitzhofer et al. |
| 5,612,099 A | 3/1997 | Thaler |
| 5,614,252 A | 3/1997 | McMillan et al. |
| 5,648,127 A | 7/1997 | Turchan et al. |
| 5,653,925 A | 8/1997 | Batchelder |
| 5,676,719 A | 10/1997 | Stavropoulos et al. |
| 5,697,046 A | 12/1997 | Conley |
| 5,705,117 A | 1/1998 | O'Connor et al. |
| 5,707,715 A | 1/1998 | deRochemont et al. |
| 5,732,885 A | 3/1998 | Huffman |
| 5,733,609 A | 3/1998 | Wang |
| 5,736,195 A | 4/1998 | Haaland |
| 5,742,050 A | 4/1998 | Amirav et al. |
| 5,746,844 A | 5/1998 | Sterett et al. |
| 5,770,272 A | 6/1998 | Biemann et al. |
| 5,772,106 A | 6/1998 | Ayers et al. |
| 5,772,964 A | 6/1998 | Prevost et al. |
| 5,775,402 A | 7/1998 | Sachs et al. |
| 5,779,833 A | 7/1998 | Cawley et al. |
| 5,795,388 A | 8/1998 | Oudard |
| 5,814,152 A | 9/1998 | Thaler |
| 5,837,960 A | 11/1998 | Lewis et al. |
| 5,844,192 A | 12/1998 | Wright et al. |
| 5,847,357 A | 12/1998 | Woodmansee et al. |
| 5,849,238 A | 12/1998 | Schmidt et al. |
| 5,854,311 A | 12/1998 | Richart |
| 5,861,136 A | 1/1999 | Glicksman et al. |
| 5,882,722 A | 3/1999 | Kydd |
| 5,894,403 A | 4/1999 | Shah et al. |
| 5,940,099 A | 8/1999 | Karlinski |
| 5,958,268 A | 9/1999 | Engelsberg et al. |
| 5,965,212 A | 10/1999 | Dobson et al. |
| 5,980,998 A | 11/1999 | Sharma et al. |
| 5,993,549 A | 11/1999 | Kindler et al. |
| 5,993,554 A | 11/1999 | Keicher et al. |
| 5,997,956 A | 12/1999 | Hunt et al. |
| 6,007,631 A | 12/1999 | Prentice et al. |
| 6,015,083 A | 1/2000 | Hayes et al. |
| 6,025,037 A | 2/2000 | Wadman et al. |
| 6,036,889 A | 3/2000 | Kydd |
| 6,046,426 A | 4/2000 | Jeantette et al. |
| 6,056,994 A | 5/2000 | Paz de Araujo et al. |
| 6,110,144 A | 8/2000 | Choh et al. |
| 6,116,718 A | 9/2000 | Peeters et al. |
| 6,136,442 A | 10/2000 | Wong |
| 6,144,008 A | 11/2000 | Rabinovich |
| 6,151,435 A | 11/2000 | Pilloff |
| 6,159,749 A | 12/2000 | Liu |
| 6,176,647 B1 | 1/2001 | Itoh |
| 6,182,688 B1 | 2/2001 | Fabre |
| 6,183,690 B1 | 2/2001 | Yoo et al. |
| 6,197,366 B1 | 3/2001 | Takamatsu |
| 6,251,488 B1 | 6/2001 | Miller et al. |
| 6,258,733 B1 | 7/2001 | Solayappan et al. |
| 6,265,050 B1 | 7/2001 | Wong et al. |
| 6,267,301 B1 | 7/2001 | Haruch |
| 6,268,584 B1 | 7/2001 | Keicher et al. |
| 6,290,342 B1 | 9/2001 | Vo et al. |
| 6,291,088 B1 | 9/2001 | Wong |
| 6,293,659 B1 | 9/2001 | Floyd et al. |
| 6,328,026 B1 | 12/2001 | Wang et al. |
| 6,340,216 B1 | 1/2002 | Peeters et al. |
| 6,348,687 B1 | 2/2002 | Brockmann et al. |
| 6,349,668 B1 | 2/2002 | Sun et al. |
| 6,355,533 B2 | 3/2002 | Lee |
| 6,379,745 B1 | 4/2002 | Kydd et al. |

| | | |
|---|---|---|
| 6,384,365 B1 | 5/2002 | Seth et al. |
| 6,390,115 B1 | 5/2002 | Rohwer et al. |
| 6,391,251 B1 | 5/2002 | Keicher et al. |
| 6,391,494 B2 | 5/2002 | Reitz et al. |
| 6,405,095 B1 | 6/2002 | Jang et al. |
| 6,406,137 B1 | 6/2002 | Okazaki et al. |
| 6,410,105 B1 | 6/2002 | Mazumder et al. |
| 6,416,156 B1 | 7/2002 | Noolandi et al. |
| 6,416,157 B1 | 7/2002 | Peeters et al. |
| 6,416,158 B1 | 7/2002 | Floyd et al. |
| 6,416,159 B1 | 7/2002 | Floyd et al. |
| 6,416,389 B1 | 7/2002 | Perry et al. |
| 6,454,384 B1 | 9/2002 | Peeters et al. |
| 6,467,862 B1 | 10/2002 | Peeters et al. |
| 6,471,327 B2 | 10/2002 | Jagannathan et al. |
| 6,481,074 B1 | 11/2002 | Karlinski |
| 6,486,432 B1 | 11/2002 | Colby et al. |
| 6,503,831 B2 | 1/2003 | Speakman |
| 6,513,736 B1 | 2/2003 | Skeath et al. |
| 6,520,996 B1 | 2/2003 | Manasas et al. |
| 6,521,297 B2 | 2/2003 | McDougall et al. |
| 6,537,501 B1 | 3/2003 | Holl et al. |
| 6,544,599 B1 | 4/2003 | Brown et al. |
| 6,548,122 B1 | 4/2003 | Sharma et al. |
| 6,564,038 B1 | 5/2003 | Bethea et al. |
| 6,573,491 B1 | 6/2003 | Marchitto et al. |
| 6,607,597 B2 | 8/2003 | Sun et al. |
| 6,608,281 B2 | 8/2003 | Ishide et al. |
| 6,636,676 B1 | 10/2003 | Renn |
| 6,646,253 B1 | 11/2003 | Rohwer et al. |
| 6,656,409 B1 | 12/2003 | Keicher et al. |
| 6,772,649 B2 | 8/2004 | Zimmermann et al. |
| 6,774,338 B2 | 8/2004 | Baker et al. |
| 6,780,377 B2 | 8/2004 | Hall et al. |
| 6,811,744 B2 | 11/2004 | Keicher et al. |
| 6,811,805 B2 | 11/2004 | Gilliard et al. |
| 6,823,124 B1 | 11/2004 | Renn et al. |
| 6,855,631 B2 | 2/2005 | Kirby |
| 6,890,624 B1 | 5/2005 | Kambe et al. |
| 6,921,626 B2 | 7/2005 | Ray et al. |
| 6,998,345 B2 | 2/2006 | Kirby |
| 6,998,785 B1 | 2/2006 | Silfvast et al. |
| 7,009,137 B2 | 3/2006 | Guo |
| 7,045,015 B2 | 5/2006 | Renn et al. |
| 7,108,894 B2 | 9/2006 | Renn |
| 7,270,844 B2 | 9/2007 | Renn |
| 7,294,366 B2 | 11/2007 | Renn et al. |
| 7,485,345 B2 | 2/2009 | Renn et al. |
| 7,658,163 B2 | 2/2010 | Renn et al. |
| 7,674,671 B2 | 3/2010 | Renn et al. |
| 8,012,235 B2 | 9/2011 | Takashima et al. |
| 2001/0046551 A1 | 11/2001 | Falck et al. |
| 2002/0012743 A1 | 1/2002 | Sampath et al. |
| 2002/0063117 A1 | 5/2002 | Church et al. |
| 2002/0071934 A1 | 6/2002 | Marutsuka |
| 2002/0082741 A1 | 6/2002 | Mazumder et al. |
| 2002/0096647 A1 | 7/2002 | Moors et al. |
| 2002/0100416 A1 | 8/2002 | Sun et al. |
| 2002/0128714 A1 | 9/2002 | Manasas et al. |
| 2002/0132051 A1 | 9/2002 | Choy |
| 2002/0162974 A1 | 11/2002 | Orsini et al. |
| 2003/0003241 A1 | 1/2003 | Suzuki et al. |
| 2003/0020768 A1 | 1/2003 | Renn |
| 2003/0048314 A1 | 3/2003 | Renn |
| 2003/0108511 A1 | 6/2003 | Sawhney |
| 2003/0108664 A1 | 6/2003 | Kodas et al. |
| 2003/0117691 A1 | 6/2003 | Bi et al. |
| 2003/0138967 A1 | 7/2003 | Hall et al. |
| 2003/0175411 A1 | 9/2003 | Kodas et al. |
| 2003/0180451 A1 | 9/2003 | Kodas et al. |
| 2003/0202032 A1 | 10/2003 | Moffat et al. |
| 2003/0219923 A1 | 11/2003 | Nathan et al. |
| 2003/0228124 A1 | 12/2003 | Renn et al. |
| 2004/0004209 A1 | 1/2004 | Matsuba et al. |
| 2004/0029706 A1 | 2/2004 | Barrera et al. |
| 2004/0038808 A1 | 2/2004 | Hampden-Smith et al. |
| 2004/0080917 A1 | 4/2004 | Steddom et al. |
| 2004/0151978 A1 | 8/2004 | Huang |
| 2004/0179808 A1 | 9/2004 | Renn |
| 2004/0185388 A1 | 9/2004 | Hirai |
| 2004/0191695 A1 | 9/2004 | Ray et al. |
| 2004/0197493 A1 | 10/2004 | Renn et al. |
| 2004/0247782 A1 | 12/2004 | Hampden-Smith et al. |
| 2005/0002818 A1 | 1/2005 | Ichikawa et al. |
| 2005/0097987 A1 | 5/2005 | Kodas et al. |
| 2005/0101129 A1 | 5/2005 | Lirby |
| 2005/0110064 A1 | 5/2005 | Duan et al. |
| 2005/0129383 A1 | 6/2005 | Renn et al. |
| 2005/0133527 A1 | 6/2005 | Dullea et al. |
| 2005/0145968 A1 | 7/2005 | Goela et al. |
| 2005/0147749 A1 | 7/2005 | Liu et al. |
| 2005/0156991 A1 | 7/2005 | Renn |
| 2005/0163917 A1 | 7/2005 | Renn |
| 2005/0184328 A1 | 8/2005 | Uchiyama et al. |
| 2005/0205415 A1 | 9/2005 | Belousov et al. |
| 2005/0205696 A1 | 9/2005 | Saito et al. |
| 2005/0214480 A1 | 9/2005 | Garbar et al. |
| 2005/0215689 A1 | 9/2005 | Garbar et al. |
| 2005/0238804 A1 | 10/2005 | Garbar et al. |
| 2005/0247681 A1 | 11/2005 | Boillot et al. |
| 2006/0003095 A1 | 1/2006 | Bullen et al. |
| 2006/0008590 A1 | 1/2006 | King et al. |
| 2006/0046461 A1 | 3/2006 | Benson et al. |
| 2006/0057014 A1 | 3/2006 | Oda et al. |
| 2006/0163570 A1 | 7/2006 | Renn et al. |
| 2006/0172073 A1 | 8/2006 | Groza et al. |
| 2006/0175431 A1 | 8/2006 | Renn et al. |
| 2006/0233953 A1 | 10/2006 | Renn et al. |
| 2006/0280866 A1 | 12/2006 | Marquez et al. |
| 2007/0019028 A1 | 1/2007 | Renn |
| 2007/0154634 A1 | 7/2007 | Renn |
| 2007/0181060 A1 | 8/2007 | Renn et al. |
| 2008/0013299 A1 | 1/2008 | Renn |
| 2009/0061077 A1 | 3/2009 | King et al. |
| 2009/0061089 A1 | 3/2009 | King et al. |
| 2009/0090298 A1 | 4/2009 | King et al. |
| 2009/0114151 A1 | 5/2009 | Renn et al. |
| 2009/0229412 A1 | 9/2009 | Takashima et al. |
| 2010/0112234 A1 | 5/2010 | Spatz et al. |
| 2010/0173088 A1 | 7/2010 | King |
| 2010/0192847 A1 | 8/2010 | Renn et al. |
| 2010/0255209 A1 | 10/2010 | Renn et al. |
| 2011/0129615 A1 | 6/2011 | Renn et al. |

FOREIGN PATENT DOCUMENTS

| | | |
|---|---|---|
| EP | 0 444 550 A2 | 9/1991 |
| EP | 0470911 | 7/1994 |
| EP | 1 258 293 | 11/2002 |
| JP | 2001-507449 | 6/2001 |
| JP | 2007-507114 | 3/2007 |
| KR | 10-2007-0008614 | 1/2007 |
| KR | 10-2007-0008621 | 1/2007 |
| WO | WO 00/23825 | 4/2000 |
| WO | WO 00/69235 | 11/2000 |
| WO | 01/83101 A1 | 11/2001 |
| WO | WO 2006/041657 A2 | 4/2006 |
| WO | WO 2006/065978 A2 | 6/2006 |

OTHER PUBLICATIONS

Ashkin, A., "Acceleration and Trapping of Particles by Radiation Pressure", Physical Review Letters, Jan. 26, 1970, 156-159.

Ashkin, A., "Optical trapping and manipulation of single cells using infrared laser beams", Nature, Dec. 1987, 769-771.

Dykhuizen, R. C., "Impact of High Velocity Cold Spray Particles", May 13, 2000, 1-18.

Fernandez De La Mora, J. et al., "Aerodynamic focusing of particles in a carrier gas", J. Fluid Mech., vol. 195, printed in Great Britain, 1988, 1-21.

King, Bruce et al., "M3D TM Technology: Maskless Mesoscale TM Materials Deposition", Optomec pamphlet, 2001.

Lewandowski, H. J. et al., "Laser Guiding of Microscopic Particles in Hollow Optical Fibers", Announcer 27, Summer Meeting—Invited and Contributed Abstracts, Jul. 1997, 89.

Marple, V. A. et al., "Inertial, Gravitational, Centrifugal, and Thermal Collection Techniques", Aerosol Measurement: Principles, Techniques and Applications, 2001, 229-260.

Miller, Doyle et al., "Maskless Mesoscale Materials Deposition", HDI, vol. 4, No. 9, Sep. 2001, 1-3.

Odde, D. J. et al., "Laser-Based Guidance of Cells Through Hollow Optical Fibers", The American Society for Cell Biology Thirty-Seventh Annual Meeting, Dec. 17, 1997.

Odde, D. J. et al., "Laser-guided direct writing for applications in biotechnology", Trends in Biotechnology, Oct. 1999, 385-389.

Rao, N. P. et al., "Aerodynamic Focusing of Particles in Viscous Jets", J. Aerosol Sci., vol. 24, No. 7, Pergamon Press, Ltd., Great Britain, 1993, 879-892.

Renn, M. J. et al., "Evanescent-wave guiding of atoms in hollow optical fibers", Physical Review A, Feb. 1996, R648-R651.

Renn, M. J. et al., "Laser-Guidance and Trapping of Mesoscale Particles in Hollow-Core Optical Fibers", Physical Review Letters, Feb. 15, 1999, 1574-1577.

Renn, M. J. et al., "Laser-Guided Atoms in Hollow-Core Optical Fibers", Physical Review Letters, Oct. 30, 1995, 3253-3256.

Renn, M. J. et al., "Optical-dipole-force fiber guiding and heating of atoms", Physical Review A, May 1997, 3684-3696.

Renn, M. J. et al., "Particle Manipulation and Surface Patterning by Laser Guidance", Submitted to EIPBN '98, Session AM4, 1998.

Renn, M. J. et al., "Particle manipulation and surface patterning by laser guidance", Journal of Vacuum Science & Technology B, Nov./Dec. 1998, 3859-3863.

Renn, Michael J. et al., "Flow-and Laser-Guided Direct Write of Electronic and Biological Components", Direct-Write Technologies for Rapid Prototyping Applications, Academic Press, 2002, 475-492.

Sobeck, et al., Technical Digest: 1994 Solid-State Sensor and Actuator Workshop, 1994, 647.

TSI Incorporated, "How a Virtual Impactor Works", www.tsi.com, Sep. 21, 2001.

Vanheusden, K. et al., "Direct Printing of Interconnect Materials for Organic Electronics", IMAPS ATW, Printing an Intelligent Future, Mar. 8-10, 2002, 1-5.

Zhang, Xuefeng et al., "A Numerical Characterization of Particle Beam Collimation by an Aerodynamic Lens-Nozzle System: Part I. An Individual Lens or Nozzle", Aerosol Science and Technology, vol. 36, Taylor and Francis, 2002, 617-631.

~ 25 mm

APPARATUSES AND METHODS FOR MASKLESS MESOSCALE MATERIAL DEPOSITION

CROSS-REFERENCE TO RELATED APPLICATIONS

This application is a continuation application of U.S. patent application Ser. No. 12/349,279, entitled "Apparatuses And Method For Maskless Mesoscale Material Deposition", filed on Jan. 6, 2009, which application is a divisional application of U.S. patent application Ser. No. 11/317,457, entitled "Apparatuses And Method For Maskless Mesoscale Material Deposition", to Michael J. Renn, et al., filed on Dec. 22, 2005, now U.S. Pat. No. 7,485,345, which is a divisional application of U.S. patent application Ser. No. 10/346,935, entitled "Apparatuses And Method For Maskless Mesoscale Material Deposition", to Michael J. Renn, et al., filed on Jan. 17, 2003, now U.S. Pat. No. 7,045,015, which is a continuation-in-part application of the following U.S. patent applications:

U.S. patent application Ser. No. 09/574,955, entitled "Laser-Guided Manipulation of Non-Atomic Particles", to Michael J. Renn, et al., filed on May 19, 2000, now U.S. Pat. No. 6,823,124, which was a continuation application of U.S. patent application Ser. No. 09/408,621, entitled "Laser-Guided Manipulation of Non-Atomic Particles", to Michael J. Renn, et al., filed on Sep. 30, 1999, now abandoned, which claimed the benefit of U.S. Provisional Patent Application Ser. No. 60/102,418, entitled "Direct-Writing of Materials by Laser Guidance", to Michael J. Renn, et al., filed on Sep. 30, 1998;

U.S. patent application Ser. No. 09/584,997, entitled "Particle Guidance System", to Michael J. Renn, filed on Jun. 1, 2000, now U.S. Pat. No. 6,636,676, which was a continuation-in-part application of U.S. patent application Ser. No. 09/574,955;

U.S. patent application Ser. No. 10/060,960, entitled "Direct Write™ System", to Michael J. Renn, filed on Jan. 30, 2002, now abandoned, which was a continuation-in-part application of U.S. patent application Ser. Nos. 09/584,997 and 09/574,955; and U.S. patent application Ser. No. 10/072,605, entitled "Direct Write™ System", to Michael J. Renn, filed on Feb. 5, 2002, now U.S. Pat. No. 7,108,894, which was a continuation-in-part application of U.S. patent application Ser. Nos. 09/584,997 and 09/574,955;

and the specifications and claims of all of the preceding references are incorporated herein by reference.

FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. N00014-99-C-0243 awarded by the U.S. Department of Defense.

FIELD OF THE INVENTION

The present invention relates generally to the field of direct write deposition.

BACKGROUND OF THE INVENTION

The present invention relates to maskless, non-contact printing of electronic materials onto planar or non-planar surfaces. The invention may also be used to print electronic materials on low-temperature or high-temperature materials, and is performed without the need for an inert atmosphere. It is also capable of deposition of micron-size features.

DESCRIPTION OF THE PRIOR ART

Various techniques may be used for deposition of electronic materials, however thick film and thin film processing are the two dominant methods used to pattern microelectronic circuits. Recently, ink jetting of conductive polymers has also been used for microelectronic patterning applications. Thick film and thin film processes for deposition of electronic structures are well-developed, but have limitations due to high processing temperatures or the need for expensive masks and vacuum chambers. Ink jetted conductive polymers have resistivities that are approximately six orders of magnitude higher than bulk metals. Thus, the high resistivity of ink jetted conductive polymers places limitations on microelectronic applications. One jetting technique disclosed in U.S. Pat. Nos. 5,772,106 and 6,015,083 use principles similar to those used in ink jetting to dispense low-melting temperature metal alloys, i.e. solder. The minimum feature size attainable with this method is reported to be 25 microns. No mention, however, of deposition of pure metals on low-temperature substrates is mentioned. U.S. Pat. Nos. 4,019,188 and 6,258,733 describe methods for deposition of thin films from aerosolized liquids. U.S. Pat. No. 5,378,505 describes laser direct write of conductive metal deposits onto dielectric surfaces. Metal precursors were dropped or spin-coated onto alumina or glass substrates and decomposed using a continuous wave laser. The Maskless Mesoscale Material Deposition (M³D™) apparatus, on the other hand, provides a method for the direct write of fine features of electronic materials onto low-temperature or high-temperature substrates. The as-deposited line features may be as small as 10 microns, and may be treated thermally or treated using laser radiation. The M³D™ process deposits liquid molecular precursors or precursors with particle inclusions, and uses a subsequent processing step that converts the deposit to the desired state. The precursor viscosity may range from approximately 1 to 1000 centi-Poises (cP), as opposed to ink jetted solutions, which are typically confined to around 10 cP. The M³D™ process may also deposit aerosolized materials onto many substrates with damage thresholds as low as 100° C., and is a maskless process that can run under ambient and inert environmental conditions.

SUMMARY OF THE INVENTION

It is an object of the present invention to provide a precision aerosol jetter for high resolution, maskless, mesoscale material deposition of liquid and particle suspensions in patterns. It is another object to provide a precision aerosol jetter that deposits electronic and biological materials with patterns in the range from about 10 microns to as large as several millimeters, while being relatively free of clogging and depositing on the orifice walls with the use of a sheath gas. It is another object to provide a precision aerosol jetter that uses aerodynamic focusing to deposit a pattern onto a planar or non-planar substrate without the use of masks. It is a further object to provide post-processing treatment of the substrate thermally or photochemically to achieve physical and/or electrical properties near that of a bulk material.

These, and other objects, are achieved by the present invention, which provides a precision aerosol jetter wherein an aerosolized liquid molecular precursor, particle suspension, or a combination of both is delivered to a flowhead via a carrier gas. The aerosolized precursor combined with the carrier gas forms an aerosol stream. The carrier gas is controlled by an aerosol carrier gas flowrate. A virtual impactor may be used to reduce the carrier gas flowrate. The virtual impactor may be composed of one or many stages. The removal of the carrier gas in this manner concentrates the aerosolized mist.

A heating assembly may be used to evaporate the aerosolized mist. A preheat temperature control is used to change the heating assembly's temperature. The aerosolized mist may also be humidified to keep it from drying out. This is accomplished by introducing water droplets, vapor, or other non-water based material into the carrier gas flow. This process is useful for keeping biological materials alive.

The resulting aerosol stream enters the flowhead and is collimated by passing through a millimeter-size orifice. An annular sheath gas composed of compressed air or an inert gas, both with modified water vapor content, enters the flowhead through multiple ports to form a co-axial flow with the aerosol stream. The sheath gas serves to form a boundary layer that prevents depositing of the particles in the aerosol stream onto the orifice wall. The aerosol stream emerges from the flowhead nozzle onto a substrate with droplets or particles contained by the sheath gas.

The aerosol stream may then pass through a processing laser with a focusing head. An acousto-optic modulator controls beam shuttering.

A shutter is placed between the flowhead orifice and the substrate in order to achieve patterning. The substrate is attached to a computer-controlled platen that rests on X-Y linear stages. A substrate temperature control is used to change the substrate's temperature. The substrate may also be composed of biocompatible material. Patterning is created by translating the flowhead under computer control while maintaining a fixed substrate, or by translating the substrate while maintaining a fixed flowhead.

A control module is used to modulate and control the automation of process parameters such as aerosol carrier gas flowrate, annular sheath gas flowrate, preheat temperature, and substrate temperature. A motion control module is used to modulate and control the X-Y linear stages, Z-axis, material shutter, and laser shutter.

A BRIEF DESCRIPTION OF THE DRAWINGS

Figure 2:
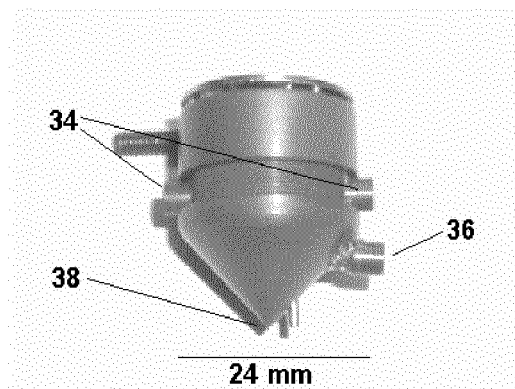
Figure 3A:
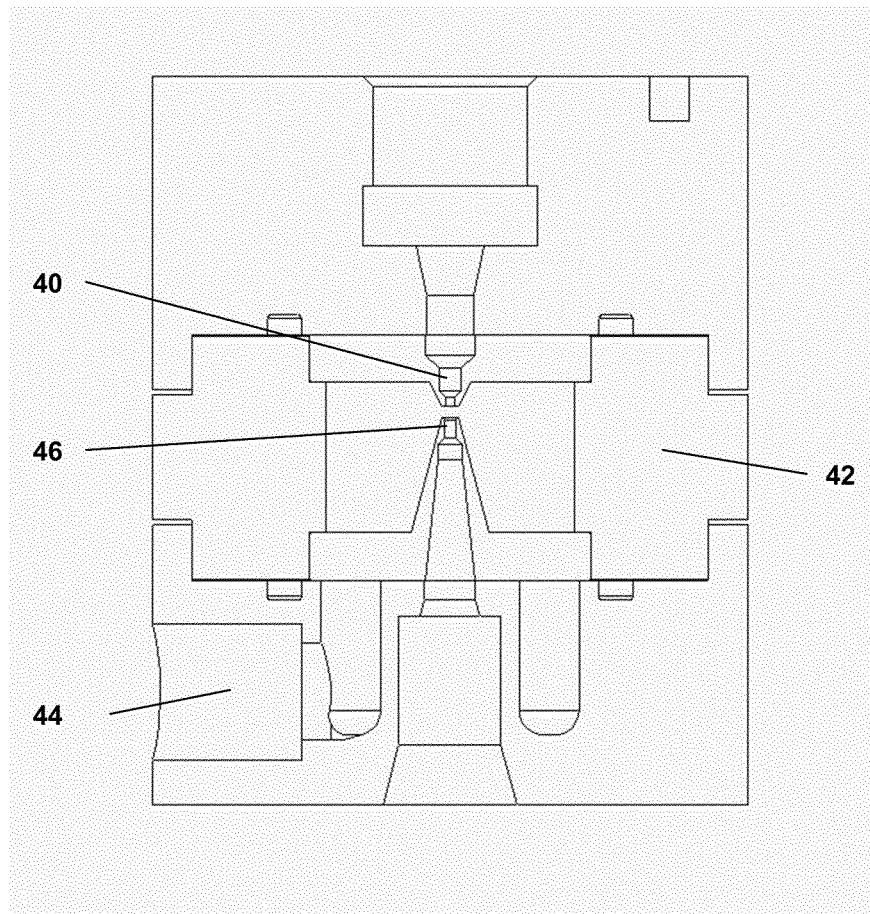
Figure 3B:
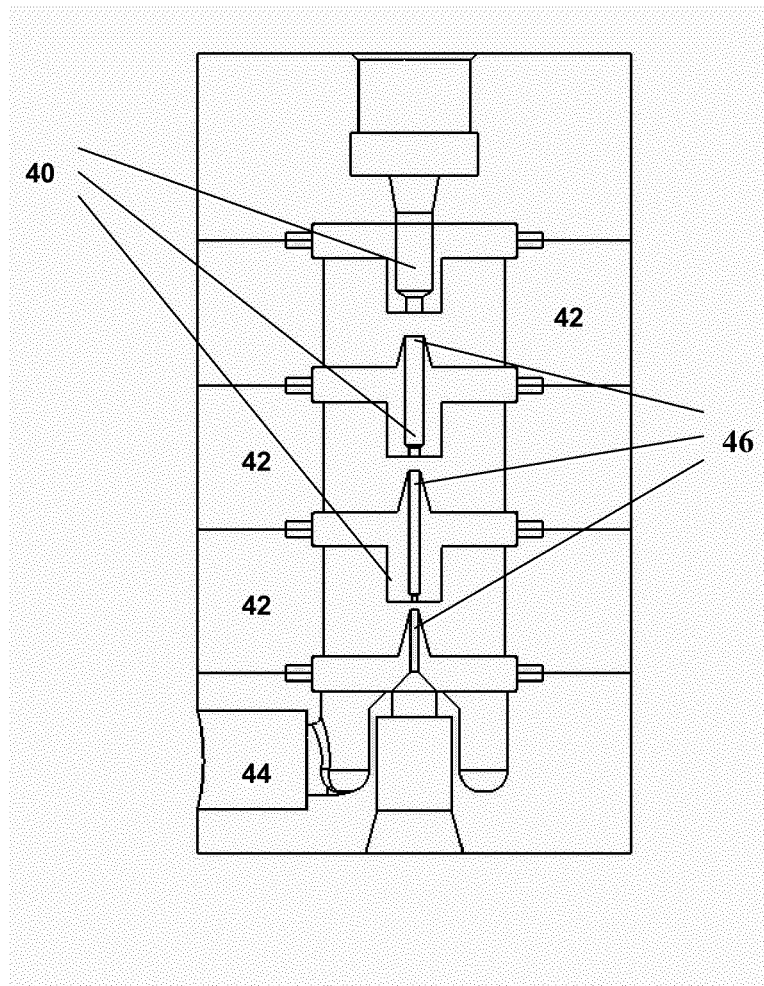
Figure 4:
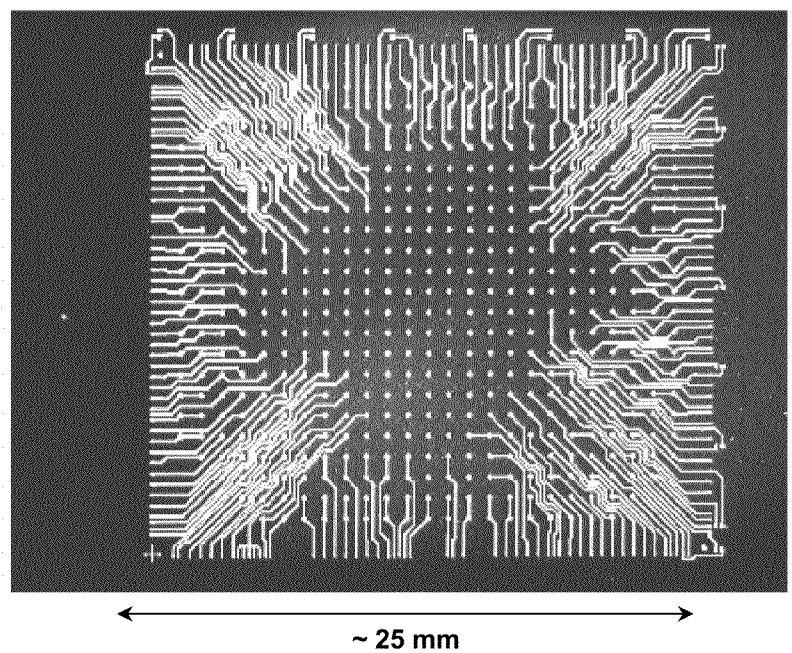
Figure 5:
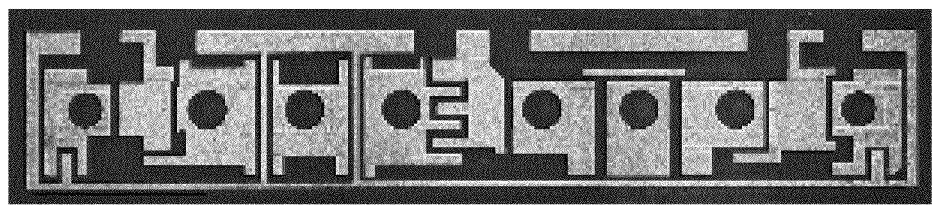
Figure 6:
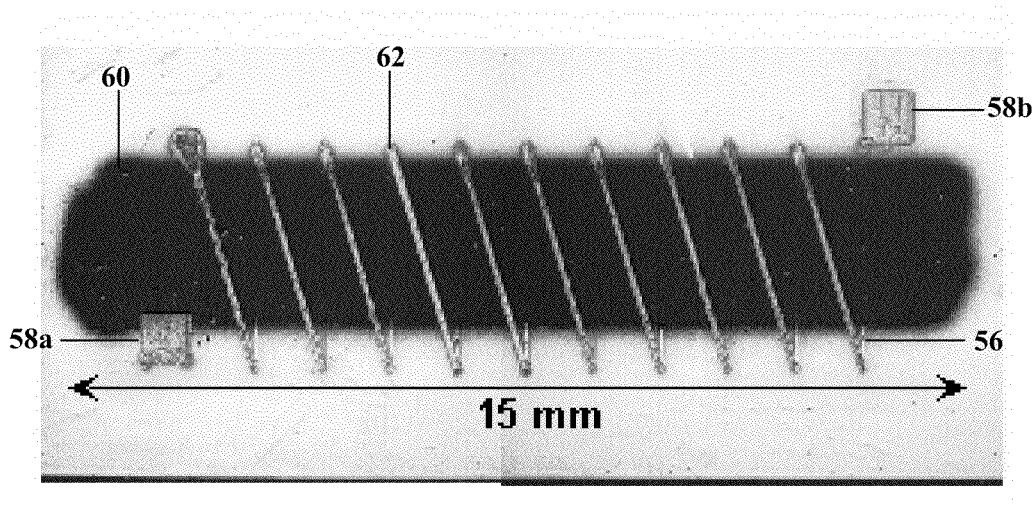

1. FIG. 1 is schematic of the M$^3$D™ apparatus.
2. FIG. 2 is a side view of the M$^3$D™ flowhead.
3. FIG. 3a is a drawing showing flow-control of a single stage virtual impactor.
4. FIG. 3b is a drawing showing flow-control of a multi-stage virtual impactor.
5. FIG. 4 shows a silver redistribution circuit deposited on Kapton™, with lines that are approximately 35 microns wide.
6. FIG. 5 shows a laser decomposed RF filter circuit on barium titanate, in which VMTool is used to pattern and decompose a silver film deposited on a barium titanate substrate.
7. FIG. 6 is a schematic representation of a three-layer direct write inductor.

A DETAILED DESCRIPTION OF THE PREFERRED AND ALTERNATIVE EMBODIMENTS

General Description

The present invention relates to apparatuses and methods for high-resolution, maskless deposition of liquid and particle suspensions using aerodynamic focusing. An aerosol stream is focused and deposited onto any planar or non-planar substrate, forming a pattern that is thermally or photochemically processed to achieve physical and/or electrical properties near that of the corresponding bulk material. The process is termed M$^3$D™, Maskless Mesoscale Material Deposition, and is used to deposit aerosolized materials with linewidths that are an order of magnitude smaller than lines deposited with conventional thick film processes. Deposition is performed without the use of masks. The term mesoscale refers to sizes from approximately 10 microns to 1 millimeter, and covers the range between geometries deposited with conventional thin film and thick film processes. Furthermore, with post-processing laser treatment, the M$^3$D™ process is capable of defining lines as small as 1 micron in width.

The present invention comprises an apparatus comprising preferably an atomizer for atomizing liquid and particle suspensions, directing, preferably a lower module for directing and focusing the resulting aerosol stream, a control module for automated control of process parameters, a laser delivery module that delivers laser light through an optical fiber, and a motion control module that drives a set of X-Y translation stages. The apparatus is functional using only the lower module. The laser module adds the additional capability of curing materials on low temperature substrates. Aerosolization is accomplished by a number of methods, including using an ultrasonic transducer or a pneumatic nebulizer. The aerosol stream is focused using the M$^3$D™ flowhead, which forms an annular, co-axial flow between the aerosol stream and a sheath gas stream. The co-axial flow exits the flowhead through a nozzle directed at the substrate. The M$^3$D™ flowhead is capable of focusing an aerosol stream to as small as one-tenth the size of the nozzle orifice. Patterning is accomplished by attaching the substrate to a computer-controlled platen. Alternatively, in a second configuration, the flowhead is translated under computer control while the substrate position remains fixed. The aerosolized fluid used in the M$^3$D™ process consists of any liquid source material including, but not limited to, liquid molecular precursors for a particular material, particulate suspensions, or some combination of precursor and particulates.

Another embodiment of the present invention is the Direct Write Biologics (DWB™) process. The DWB™ process is an extension of the M$^3$D™ process wherein biological materials are deposited in mesoscale patterns on a variety of biocompatible substrates. Like the M$^3$D™ process, an aerosol is first generated, and materials are deposited onto the desired substrate surface. Stock solutions containing biological molecules such as functional catalytic peptides, extracellular matrix (ECM) and fluorescent proteins, enzymes, or oligonucleotides have all demonstrated post-process functionality. A wide range of biological materials have been deposited using the direct-write method. Indeed, biomaterial aerosols containing biologically active molecules can be deposited into patterned structures to generate engineered substrates. In addition, possible whole cell deposition applications include embedded architecture tissue constructs and tissue-based biosensor development.

Applications of the M$^3$D™ process include, but are not limited to, direct write of circuits and devices for electronic applications, as well as the direct write of materials for biological applications.

Preferred Embodiment

1. Aerosolization

FIG. 1 shows the preferred M$^3$D™ apparatus. Like reference numerals are used to describe the same elements throughout the various figures in order to create parity and for convenience of illustration. The M³D™ process begins with the aerosolization of a solution of a liquid molecular precursor or suspension of particles. The solution may also be a combination of a liquid molecular precursor and particles. As by way of example, and not intended as limiting, precursor solutions may be atomized using an ultrasonic transducer or pneumatic nebulizer 14, however ultrasonic aerosolization is limited to solutions with viscosities of approximately 1-10 cP. The fluid properties and the final material and electrical properties of the deposit are dependent on the precursor chemistry. Aerosolization of most particle suspensions is performed using pneumatics, however ultrasonic aerosolization may be used for particle suspensions consisting of either small or low-density particles. In this case, the solid particles may be suspended in water or an organic solvent and additives that maintain the suspension. Fluids with viscosities from approximately 1 to 1000 cP may be atomized pneumatically. These two methods allow for generation of droplets or droplet/particles with sizes typically in the 1-5 micron size range.

2. Flow Development and Deposition

Aerosol Delivery, Drying, and Humidification

The mist produced in the aerosolization process is delivered to a deposition flowhead 22 using a carrier gas. The carrier gas is most commonly compressed air or an inert gas, where one or both may contain a modified solvent vapor content. The carrier gas flowrate is controlled by a carrier gas controller 10. The aerosol may be modified while transiting through a heating assembly 18. The heating assembly 18 is used to evaporate the precursor solvent and additives or the particle-suspending medium. This evaporation allows for the modification of the fluid properties of the aerosol for optimum deposition. Partial evaporation of the solvent increases the viscosity of the deposited fluid. This increased viscosity allows for greater control of the lateral spreading of the deposit as it contacts the substrate 28. A preheat temperature control 20 is used to change the heating assembly's temperature. In contrast, in some cases, humidifying the carrier gas is necessary to prevent drying of the aerosol stream. Humidification of the sheath airflow is accomplished by introducing aerosolized water droplets, vapor, or other non-water based material into the flow. This method is used in the case where the solvent used for a particular precursor material would otherwise completely evaporate before the aerosol reaches the substrate 28.

General Description of Flow-Guidance

FIG. 2 shows the preferred M³D™ flowhead. In the flow guidance process, the aerosol stream enters through ports mounted on the flowhead 22 and is directed towards the orifice 38. The mass throughput is controlled by the aerosol carrier gas flowrate. Inside the flowhead 22, the aerosol stream is initially collimated by passing through a millimeter-size orifice. The emergent particle stream is then combined with an annular sheath gas. The sheath gas is most commonly compressed air or an inert gas, where one or both may contain a modified solvent vapor content. The sheath gas enters through the sheath air inlet 36 below the aerosol inlet 34 and forms a co-axial flow with the aerosol stream. The sheath gas is controlled by a sheath gas controller 12. The combined streams exit the chamber through an orifice 38 directed at the substrate 28. This co-axial flow focuses the aerosol stream onto the substrate 28 and allows for deposition of features with dimensions as small as 10 microns. The purpose of the sheath gas is to form a boundary layer that both focuses the particle stream and prevents particles from depositing onto the orifice wall. This shielding effect minimizes clogging of the orifices. The diameter of the emerging stream (and therefore the linewidth of the deposit) is controlled by the orifice size, the ratio of sheath gas flow rate to carrier gas flow rate, and the spacing between the orifice and the substrate. In a typical configuration, the substrate 28 is attached to a platen that moves in two orthogonal directions under computer control via X-Y linear stages 26, so that intricate geometries may be deposited. Another configuration allows for the deposition flowhead to move in two orthogonal directions while maintaining the substrate in a fixed position. The process also allows for the deposition of three-dimensional structures.

Virtual Impaction

Many atomization processes require a higher carrier gas flow rate than the flowhead can accept. In these cases, a virtual impactor is used in the M³D™ process to reduce the flowrate of the carrier gas, without appreciable loss of particles or droplets. The number of stages used in the virtual impactor may vary depending on the amount of excess carrier gas that must be removed. By way of example, FIG. 3*a* shows a single stage virtual impactor.

A single stage virtual impactor comprises a nozzle 40, a large chamber 42 with an exhaust port 44 and a collection probe 46. The nozzle 40 and collection probe 46 are opposed to each other within the chamber 42. A particulate laden gas stream, referred to as the total flow, $Q_0$ is accelerated through the nozzle 40 into the chamber 42. The jet of particulate laden gas penetrates the collection probe 46, however most of the gas flow reverses direction and exits the collection probe 46 back into the chamber 42. This flow is referred to as the major flow and is exhausted. The flow that remains in the collection probe 46 is referred to as the minor flow and is directed downstream for further processing. Particles having sufficient momentum will continue to follow a forward trajectory through the collection probe 46 and will be carried by the minor flow. Particles with insufficient momentum will be exhausted with the major flow. Momentum of the particles is controlled by the particle size and density, the gas kinematic properties, and the jet velocity. The particle size at which particles have just enough momentum to enter the collection probe 46 is referred to as the cut-point of the impactor. In order for the virtual impactor to function properly, the exhaust gas must be removed from the chamber 42 at a specific flowrate. This may be accomplished by feeding the exhaust gas through a flow control device such as a mass flow controller. In the event that ambient conditions do not provide a sufficient pressure drop to achieve the flowrates required for proper operation, a vacuum pump may be used.

In the present invention, the particles entrained in the gas stream consist of droplets, generally in the size range of 1-5 microns although droplets smaller than 1 micron and as large as 50 microns may be used. Particles larger than the cut-point enter the collection probe 46 and remain in the process. These are directed into other devices downstream of the impactor. Droplets smaller than the cut-point remain in the stripped excess gas and are no longer part of the process. These may be exhausted to the atmosphere through the exhaust port 44, filtered to avoid damaging flow control devices, or collected for reuse.

The efficiency of the virtual impactor is determined by the amount of aerosol that remains in the minor flow and is not stripped out in the major flow along with excess gas or physically impacted out in the virtual impactor. Close geometrical control of the impactor can improve the efficiency, as can control of the particle size distribution in the aerosol. By shifting the particle size distribution above the cut-point of the impactor, all the particles will remain in process, minimizing both waste and clogging. Another option exists to intentionally design an impactor stage to strip off particles below a certain size range, such that only particles above a certain size are presented to the downstream processes. Since the deposition is a physical impaction process, it may be advantageous to present only droplets of a certain size to the substrate. For example, resolution may be improved by depositing only 5 micron sized droplets. Other examples where it may be advantageous to deposit only certain sized droplets include via filling.

In the event that a single stage of virtual impaction is insufficient to remove enough excess carrier gas, multiple stages of impaction may be employed. FIG. 3b shows a multistage virtual impactor. In this case, the output from the collection probe 46 of the first virtual impactor is directed into the nozzle 40 of the second impactor and so on, for the required number of stages.

Shuttering

A computer-controlled material shutter 25 is placed between the flowhead orifice and the substrate 28. FIG. 1 shows the shutter. The shutter 25 functions to interrupt the flow of material to the substrate 28 so that patterning is accomplished.

Temperature Control

A substrate temperature control 30 is used to change the temperature of the substrate 28, as shown in FIG. 1.

3. Control Module

The M³D™ control module provides automated control of process parameters and process monitoring. The process parameters include the aerosol and sheath gas flowrates, the aerosol preheat temperature and the substrate temperature. The control module may be operated as a stand-alone unit via manual input on the front panel, or remotely via communication with a host computer. Remote operation via a host computer is preferable for coordinating the deposition system with the other components of the M³D™ system.

4. Laser Delivery Module

The M³D™ apparatus uses a commercially available laser 24. Deposits are typically processed using a continuous wavelength frequency-doubled Nd:YAG laser, however processing may be accomplished with a variety of lasers, granted that the deposit is absorbing at the laser wavelength. The laser delivery module comprising a laser, a mechanical shutter, an acousto-optic modulator, delivery optics, and a focusing head. The mechanical shutter is used to rapidly turn the laser on and off in coordination with the motion control system. The acousto-optic modulator is used for rapid dynamic power control, which optionally may also be coordinated with motion. The delivery optics may be either an optical fiber and associated launch optics or mirrors. The laser delivery module is controlled via communication with the host computer.

5. Motion Control Module

The motion control module consists of a motion control card, an I/O interface, X-Y linear stages 26 for moving either the substrate or the deposition system, a z-axis for positioning the deposition system above the substrate and amplifiers for driving the stages. The I/O interface, amplifiers and associated power supplies are housed in an external, rack mountable enclosure. The motion control card typically is installed in the host computer and is connected to the I/O interface via a special cable. The I/O interface consists of analog outputs to the drive amplifiers and discrete outputs for actuating the material and laser shutters. Control of these components is handled by the motion control module rather than their respective control modules so that the timing of shuttering events can be coordinated with motion.

6. Materials

The M³D™ process has been used to deposit a range of materials, including electronic and biological materials. Aerosolization of these materials may be from liquid precursor inks, particulate suspensions or combinations of both precursors and particulates. Aerosolization of fluids from roughly 1 to 1000 cP is possible. Biological materials may be deposited without loss of functionality. The materials developed specifically for the M³D™ process have low processing temperatures (150° C. to 200° C.), may be written with linewidths as small as 10 microns, have excellent adhesion to plastic, ceramic, and glass substrates, and have electrical properties near that of the bulk material. Electronic materials may be processed thermally, or using laser treatment.

The M³D™ process can also be used in multiple material deposition. For example, the M³D™ process can be used to deposit different materials within a single layer, or it can be used to deposit different materials onto different layers.

Metals

The M³D™ process can be used to deposit metals such as silver, platinum, palladium, rhodium, copper, gold, and silver/palladium and platinum/rhodium alloys. In the most general case, metal structures are formed from aerosolized liquid precursors for the desired metals, however precursors are also formulated with nanometer-size metal particles. The inclusion of nanometer-sized metal particles is beneficial to many aspects of the system, including, but not limited to, optimization of fluid properties, improved densification and final properties of the deposit. A particular strength of the apparatus/material combination is that maskless deposition onto substrates with damage thresholds as low as 150° C. may be achieved. Optimized fluid properties and apparatus parameters also allow for deposition with linewidths as small as 10 microns. Subsequent laser processing may be used to define features with linewidths as small as 1 micron. The precursor formulations also provide good adhesion to Kapton™ (as shown in FIG. 4), glass, barium titanate (as shown in FIG. 5), and various plastics.

The M³D™ process can be used to direct write metal traces with linewidths as small as 1 micron, and as large as 100 microns. Electrical interconnects have been written with linewidths from 10 microns to 250 microns. In general, the resistivity of the traces is from 2 to 5 times that of the bulk metal insulators. A silver/glass formulation has been used as a low-ohmic resistive system, capable of producing traces with resistances from approximately 1 ohm to 1 kohm. The formulation consists of a silver/palladium precursor and a suspension of fumed silica particles. The process can be used to write resistor terminations, interdigitated capacitors, inductive coils, and spiral antennas and patch antennas. The M³D™ process can also be used to deposit reflective metals with very low surface roughness for micro-mirror applications.

Ceramics

The M³D™ process can be used to direct write ceramics, including insulators, mid- and high-k dielectrics, resistor materials and ferrites. Source materials have been precursors, colloidal suspensions and mixtures of the two. Low-k dielectric materials such as glass have been deposited both for dielectric layers in capacitor applications, as well as insulation or passivation layers. High-k dielectrics such as barium titanate can be deposited for capacitor applications, ruthenates have been deposited to form resistors and manganeses zinc ferrites have been deposited to form inductor cores.

A broad range of ceramics may be deposited and fired conventionally. However, densification on low temperature substrates can only be achieved for materials that can be densified either at temperatures below the damage threshold of the substrate or by laser treatment.

Polymers

The M³D™ process can be used to directly write polymeric materials. The liquid source materials can be monomers, solutions, suspensions, or any combination of these. Examples of polymers that have been deposited include polyimide, polyurethane and UV curable epoxies. The final treatment of the deposit is dependant on the specific polymer, but may include thermal heating, laser processing or exposure to UV. Polymeric deposits have been used as low-k dielectrics for capacitors and overcoat dielectrics for electrical and environmental insulation.

The M³D™ process can also be used to deposit traditional electronic materials onto polymers, such as polyimide, polyetheretherketone (PEEK), Teflon™, and polyester, at temperatures below those required to cause damage.

Resistive Lines

Resistive traces with resistances spanning six orders of magnitude can be deposited using the M³D™ process. A silver/glass formulation has been used as a low-ohmic system, capable of producing traces with resistances from approximately 1 ohm to 1 kohm. The formulation consists of a silver/palladium precursor and a suspension of fumed silica particles. A mid to high ohmic formulation has been developed using a suspension of ruthenium oxide particles in dimethylacetimide. Resistances from roughly 50 ohm to 1 Mohm are possible with the Ruthenium Oxide system.

Inductive Deposits

Inductive materials may also be deposited using the M³D™ process. A zinc/manganese ferrite powder combined with a low-melting temperature glass powder has been atomized and deposited onto Kapton™. Both thermal and laser processes can be used to sinter the powder. Both processes resulted in a dense well-adhered ferrite layer.

Other Materials

The M³D™ process can deposit a myriad of other materials for various processes. For example, the M³D™ process can be used to deposit sacrificial and resist materials for subsequent processing of a substrate, such as in chemical etching. It can also deposit sacrificial materials to form support structures onto or into a structure using additional materials. The M³D™ process can deposit solvent and etching chemicals to directly texture a substrate. The M³D™ process can also be used to deposit dissimilar materials in the same location for further processing to form a multi-phase mixture, alloy, or compound, and it can deposit dissimilar materials to form structures with a compositional gradient. The M³D™ process can create porosity or channels in structures by depositing fugitive materials for later removal. The M³D™ process can also deposit materials, which are structural in nature.

7. Heat Treatment

In the M³D™ process either thermal treatment or laser treatment may be used to process deposited materials to the desired state. In the case of metal precursors, dense metal lines may be formed with thermal decomposition temperatures as low as 150° C. For precursor-based materials, thermal treatment is used to raise the temperature of the deposit to its decomposition or curing temperature. In these processes, a chemical decomposition or crosslinking takes place as a result of the input of thermal energy, such that the precursor changes its molecular state, resulting in the desired material plus some effluents. An example of a chemical decomposition of a molecular precursor to a metal is that of the reaction of silver nitrate, a metal salt, to form silver plus nitrogen, oxygen, and nitrogen/oxygen compounds.

In the curing process, heat is added to the deposit until the effluents are driven off and polymerization takes place. Chemical decomposition has also been accomplished using laser radiation as the heat source. In this case, the precursor or precursor/particle combination is formulated so that the fluid is absorbing at the laser wavelength. The high absorption coefficient at the laser wavelength allows for very localized heating of the deposit, which in turn may be used to produce fine deposits (as small as 1 micron for a frequency-doubled Nd:YAG laser) with no damage to the substrate. The M³D™ process has been used to deposit and laser process silver on an FR4 substrate, which has a damage threshold of less than 200° C.

In the deposition of ceramics and other refractory powders, laser sintering is used to soften low-melting temperature particles used to bind the refractory powder. In this process the laser is scanned over the deposit and absorbed by the glass or the powder, softening the glass to the point that adhesion takes place between particles and the substrate.

In the case of DWB™, thermal treatment is used to incubate deposited samples. The goal of incubation is to produce a desired chemical reaction, such as the development of enzyme activity.

8. Direct Write of Biological Materials

Cell patterning by flow-guided direct writing may revolutionize cell patterning technology by allowing for precise cellular micro-patterning and addition of biologically active adhesion or pathway signaling biomolecules. This is the most general advantage and arguably the most revolutionary component of the DWB™ technology. The direct-write method can be used to guide and deposit 0.02 µm to 20 µm diameter biological particles onto substrate surfaces. The range of biological materials that can be deposited is extremely broad, and includes polymers, peptides, viruses, proteinaceous enzymes and ECM biomolecules, as well as whole bacterial, yeast, and mammalian cell suspensions.

9. Products and Applications

Two examples of devices that demonstrate the capabilities of the M³D™ process are described. The first device is a manganese-zinc ferrite inductor written on alumina, as shown in FIG. 6. This device demonstrates deposition of silver precursor plus laser processing of the deposit. The silver precursor is ultrasonically atomized from liquid precursor solution, In addition, a ferrite and glass particle suspension is pneumatically atomized, deposited, and laser densified. The silver deposition illustrates the capability to deposit over a non-planar surface. The second device is a silver spiral on Kapton™, demonstrating fine feature size and direct write of silver onto a low-temperature substrate.

Direct Write Inductor

A three-dimensional ferrite-core inductor has been built using the M³D™ apparatus and process. FIG. 6 shows a three-layer direct write inductor. The first step of the inductor fabrication is the deposition of parallel lines of silver precursor 56 onto an alumina substrate. The lines are approximately 100 microns wide, 1 micron thick and 1000 microns in length. The lines are laser treated to form dense, conductive silver wires. These wires are one-half of the conductive traces that will eventually wrap around a ferrite core. Silver contact pads 58a-b (1000 micron square) are also added in the first layer.

The second step is to create the inductor core 60 by depositing a mixture of Manganese-Zinc Ferrite powder and low melting temperature glass over the conductive lines. Laser sintering is used to densify the ferrite/glass deposit; the glass flows around the ferrite particles and forms a dense, connected solid after cooling. The ferrite deposition step is repeated several times to buildup the deposit to about 150 microns. The ferrite line lengths are about 1500 mm long. A typical profile of the ferrite layer is shown in FIG. 6.

The final step is to write conductive traces over the ferrite layer and connect them to the underlying traces to form the inductor coil 62. Since the flowguide head standoff distance is several mm, deposition over a mm-sized non-planar surface is possible. The resistance of a typical coil generated using this method is on the order of several ohms. The inductance is 7 micro henries and the Q value is 4.2 @ 1 MHz.

Direct Write Spiral

The $M^3D^{TM}$ process has been used to form a direct write spiral, which shows the line definition and feature size capabilities of the process. The spiral lines are 35 microns in diameter on a 60-micron pitch. The overall diameter of the coil is 2.0 mm. The start material is silver ink that was deposited and then treated at 200° C. to chemically decompose the precursors and densify the deposit. In depositing this pattern, the substrate was translated beneath the deposition head at a speed of 10 mm/s Other Applications The $M^3D^{TM}$ process can be used to perform a plethora of other applications. It can perform layerwise deposition of materials to form functional devices, such as multilayer capacitors, sensors, and terminated resistors. It has the capacity to deposit multiple materials to form structures, such as interconnects, resistors, inductors, capacitors, thermocouples, and heaters, on a single layer. The $M^3D^{TM}$ process can deposit multilayer structures consisting of conductor patterns and dielectric insulating layers, in which the conductor patterns may be electrically connected by conducting vias. It can deposit a passivation material to protect or insulate electronic structures. It can deposit overlay deposits for the purpose of "additive trimming" of a circuit element, such as adding material to a resistor to alter its value. The $M^3D^{TM}$ process can also deposit these overlay deposits on top of existing structures, which is difficult to achieve with screen printing.

In the area of novel microelectronic applications, the $M^3D^{TM}$ process can deposit materials between preexisting features to alter a circuit or repair broken segments. It can deposit metal films with tapered linewidths for devices, such as a stripline antennae. It can also deposit material to form "bumps" for chip attachment. The $M^3D^{TM}$ process can deposit adhesive materials to form dots or lines for application to bonding multiple substrates and devices. The $M^3D^{TM}$ process can also deposit materials into underfill regions, in which the deposit is pulled into the underfill region by capillary forces.

In a printing application, the $M^3D^{TM}$ process can deposit three-dimensional patterns to fabricate a master stamp. It can also deposit colored pigments (e.g. red, green, blue) to generate high resolution colored deposits.

The $M^3D^{TM}$ process may also be used in several optoelectronic applications, and can deposit transparent polymers into lines and dots to serve as lenses and optical conductors. It can also deposit repetitive structures, such as lines and dots, to refract or reflect light and to serve as diffractive optical elements, such as diffraction gratings or photonic bandgaps. It can deposit metal and dielectric films with tapered film thickness, in which the films can serve as optical phase retarders that can encode holographic information into light beams. Examples of this are phase shift masks, diffractive optical elements, and holograms. The $M^3D^{TM}$ process can also deposit metal and opaque films of variable thickness for controlled reflection and absorption of light. Such a process can be used to make high-resolution portraits.

The $M^3D^{TM}$ process can deposit materials that form a thermal or chemical barrier to the underlying substrate. It can deposit materials that have a primary function of bearing a load, reducing friction between moving parts, or increasing friction between moving parts. It can also deposit materials used to form memory devices. Further, the $M^3D^{TM}$ process can deposit materials that form a logic gate.

10. Direct Write Biological (DWB™) Applications

The DWB™ initiative may be applied to material deposition applications including biosensor rapid prototyping and microfabrication, microarray bio-chip manufacturing, bioinspired electroactive polymer concept development (ambient temperature bio-production of electronic circuitry), and various additive biomaterial processes for hybrid BioMEMS and Bio-Optics. Moreover, the ability to deposit electronic and biologically viable or active materials with mesoscale accuracy has potential to advance these application areas.

The $M^3D^{TM}$ process can also be used to deposit multiple materials in a dot-array geometry for biological applications, such as for protein and DNA arrays. It can deposit passivation material to protect or insulate biological structures. It can also deposit an overlay material onto an existing structure that selectively allows migration of certain chemical or biological species to the existing structure while preventing the passage of others. Further, the $M^3D^{TM}$ process can deposit materials containing a chemical or biological species that is released as a function of time or an internal or external stimulus.

11. Topological Deposition

The $M^3D^{TM}$ process can perform various topological depositions. For example, it can deposit spots, lines, filled areas, or three-dimensional shapes. It has the capability to perform conformal deposition over curved surfaces and steps. It can deposit into channels or trenches, or onto the sides of channel walls. It can deposit into via holes as small as 25 microns.

The $M^3D^{TM}$ process can deposit across multiple substrate materials. It can deposit longitudinally or circumferentially around cylindrically-shaped objects. It can also deposit both internally or externally onto geometrical shapes having flat faces that meet as sharp corners, such as cubes. The $M^3D^{TM}$ process can deposit onto previously deposited material. It can also deposit films with variable layer thickness. Further, the $M^3D^{TM}$ process can deposit films or lines with variable widths.

CONCLUSION

Although the present invention has been described in detail with reference to particular preferred and alternative embodiments, persons possessing ordinary skill in the art to which this invention pertains will appreciate that various modifications and enhancements may be made without departing from the spirit and scope of the Claims that follow. The various configurations that have been disclosed above are intended to educate the reader about preferred and alternative embodiments, and are not intended to constrain the limits of the invention or the scope of the Claims. The List of Reference Characters which follows is intended to provide the reader with a convenient means of identifying elements of the invention in the Specification and Drawings. This list is not intended to delineate or narrow the scope of the Claims.

LIST OF REFERENCE CHARACTERS

FIG. 1

10 Carrier gas controller
12 Sheath gas controller
14 Pneumatic nebulizer/Ultrasonic atomizer
16 Virtual impactor
18 Heating assembly
20 Preheat temperature control
22 Flowhead
24 Processing laser
25 Shutter
26 X-Y linear stages
28 Substrate
30 Substrate temperature control
32 Computer

FIG. 2

34 Aerosol/carrier gas inlet
36 Sheath air inlet
38 Orifice

FIG. 3a

40 Nozzle
42 Chamber
44 Exhaust port
46 Collection probe

FIG. 3b

No new reference numerals required.

FIG. 4

No reference numerals required.

FIG. 5

No reference numerals required.

FIG. 6

56 Parallel lines of silver precursor
58a-b Silver contact pads
60 Inductor core
62 Inductor coil Although specific embodiments have been described and illustrated herein, it will be appreciated by those skilled in the art that any arrangement, which is calculated to achieve the same purpose, may be substituted for the specific embodiments shown. Therefore, this application is intended to cover any adaptations or variations of the present invention. Therefore, it is manifestly intended that this invention only be limited by the following claims.

What is claimed is:

1. A method for maskless material deposition of a liquid or liquid containing a particle suspension in a pattern on a target, the method comprising:
   focusing an aerosol stream comprising droplets of the liquid;
   surrounding the aerosol stream with an annular sheath gas;
   subsequently passing the aerosol stream through no more than one orifice;
   depositing the aerosol stream in a pattern onto a planar or non-planar substrate without use of masks to form a deposit comprising a feature size of less than one millimeter; and
   processing the deposit so that the deposit comprises physical and/or electrical properties near those of a bulk material.

2. The method as claimed in claim 1, wherein the liquid is a liquid molecular precursor or a particle suspension.

3. The method as claimed in claim 2 further comprising using ultrasonic aerosolization for particle suspensions comprising either or both of high-density nanometer-sized particles ranging from 4 to 21 $g/cm^3$ and low-density micron-sized particles on the order of 2 $g/cm^3$ or less.

4. The method as claimed in claim 1, further comprising the step of atomizing the liquid using an ultrasonic transducer or a pneumatic nebulizer, thereby forming said droplets.

5. The method as claimed in claim 1, wherein the liquid has a viscosity of approximately 1-10 cP.

6. The method as claimed in claim 1, wherein the aerosol stream includes biological materials selected from the group consisting of functional catalytic peptides, extracellular matrix and fluorescent proteins, enzymes, and oligonucleotides.

7. The method as claimed in claim 1, wherein the aerosol stream is delivered to a deposition head via a carrier gas.

8. The method as claimed in claim 7, wherein the carrier gas and/or the sheath gas is selected from the group consisting of compressed air, an inert gas, a solvent vapor, and a combination thereof.

9. The method as claimed in claim 7, further comprising humidifying the carrier gas and/or the annular sheath gas to prevent the drying of the aerosol stream.

10. The method as claimed in claim 9, wherein humidifying the carrier gas and/or the annular sheath gas comprises introducing aerosolized water droplets and/or water vapor into the carrier gas flow, the sheath gas flow, and/or the aerosol stream.

11. The method as claimed in claim 7, wherein a mass throughput of the aerosol stream is controlled by a flowrate of the carrier gas.

12. The method as claimed in claim 11, further comprising concentrating the aerosol stream by partially removing of the carrier gas.

13. The method as claimed in claim 12, wherein the carrier gas is partially removed by one or more stages of a virtual impactor.

14. The method as claimed in claim 1 further comprising at least partially evaporating a solvent and/or a suspending fluid, thereby modifying fluid properties of the aerosol stream.

15. The method as claimed in claim 14, wherein at least partially evaporating a solvent and/or a suspending fluid increases viscosity of the aerosol stream, thereby enabling greater control of a lateral spreading of the deposit.

16. The method as claimed in claim 1, wherein the annular sheath gas forms a co-axial flow with the aerosol stream.

17. The method as claimed in claim 16, wherein the co-axial flow exits a flowhead through a nozzle comprising an orifice, the nozzle directed at the substrate.

18. The method as claimed in claim 17, wherein the annular sheath gas forms a boundary layer that focuses the aerosol stream and/or prevents particles in the aerosol from depositing onto a surface of the orifice.

19. The method as claimed in claim 18, wherein the co-axial flow is focused as small as a tenth of a size of the nozzle orifice.

20. The method as claimed in claim 17, further comprising interrupting flow of the aerosol stream to the substrate by operating a shutter disposed between the nozzle orifice and the substrate.

21. The method as claimed in claim 20, further comprising patterning the deposit by operating the shutter and translating the nozzle relative to the substrate.

22. The method as claimed in claim 21, wherein patterning features of the deposit range in scale from approximately 10 microns to as large as several millimeters.

23. The method as claimed in claim 1, wherein processing the deposit comprises raising a temperature of the deposit to a decomposition temperature, sintering temperature, or curing temperature of the deposit.

24. The method as claimed in claim 23, wherein the deposit comprises a precursor and thermal treatment of the deposit causes a chemical decomposition or crosslinking to occur in the deposit, thereby changing a molecular state of the precursor.

25. The method as claimed in claim 1, wherein the deposit comprises one or more elements selected from the group consisting of an electrical interconnect; a resistor termination, an interdigitated capacitor; an inductive core or coil; a spiral antenna; a patch antenna; a reflective metal for micromirror applications; a dielectric layer for capacitor applications; an insulating or passivating layer; an overcoat dielectric; patterned biological cells; one or more interconnects, resistors, inductors, capacitors, thermocouples, or heaters on a single layer; an overlay deposit; a structure deposited between preexisting features to alter a circuit or repair a broken circuit element; a metal film comprising a tapered linewidth; colored pigments; patterned transparent polymer; periodic optical structures, variable thickness metal and/or opaque film; a thermal or chemical barrier to the underlying substrate; a chemical or biological species which is time released or released in response to a certain internal or external stimulus; and a film or line comprising a variable linewidth.

26. The method of claim 25 wherein the deposit comprises one or more element selected from the group consisting of an electrical interconnect comprising a linewidth between about 10 microns and about 250 microns; a spiral antenna comprising silver and the substrate comprising Kapton™; an overlay deposit used for additive trimming of a circuit element; an overlay deposit disposed on top of an existing structure; a metal film comprising a tapered linewidth used for a stripline antenna; colored pigments comprising red, green, and blue pigments; colored pigments used in a high resolution display; a patterned transparent polymer comprising lines and or dots; a patterned transparent polymer forming a lens or an optical conductor; periodic optical structures refracting light; periodic optical structures reflecting light; periodic optical structures forming a diffractive optical element; periodic optical structures forming a diffractive optical element comprising a diffraction grating; periodic optical structures forming a diffractive optical element comprising a photonic bandgap; a variable thickness metal film controlling reflection and absorption of light; a variable thickness metal film used in a high-resolution portrait; a variable thickness opaque film controlling reflection and absorption of light; and a variable thickness opaque film used in a high-resolution portrait.

27. The method of claim 1 further comprising rapidly prototyping and/or microfabricating a biosensor.

28. The method of claim 1 wherein the aerosol stream is deposited in one or more ways selected from the group consisting of into a channel or trench, on the side of a channel wall or trench wall, conformally over a curved surface, conformally over a step, into a via hole, across multiple substrate materials, and longitudinally or circumferentially around a cylindrically-shaped object.

29. The method as claimed in claim 1, wherein the processing step comprises photochemically processing the deposit.

30. The method as claimed in claim 29, wherein the deposit is photochemically processed by a laser.

31. The method as claimed in claim 1, wherein the substrate comprises a biocompatible material.

* * * * *